United States Patent [19]
Lin et al.

[11] Patent Number: 5,587,342
[45] Date of Patent: Dec. 24, 1996

[54] METHOD OF FORMING AN ELECTRICAL INTERCONNECT

[75] Inventors: Jong-Kai Lin; William H. Lytle, both of Chandler; Ravichandran Subrahmanyan, Mesa, all of Ariz.

[73] Assignee: Motorola, Inc., Schaumburg, Ill.

[21] Appl. No.: 415,972

[22] Filed: Apr. 3, 1995

[51] Int. Cl.$^6$ ................................................. H01L 21/60
[52] U.S. Cl. ........................... 437/209; 437/183; 437/189; 437/203
[58] Field of Search .................................. 437/209, 203, 437/183, 189, 192

[56] References Cited

U.S. PATENT DOCUMENTS

| | | |
|---|---|---|
| 4,806,706 | 2/1989 | Machida et al. . |
| 5,093,279 | 3/1992 | Andreshak et al. ............... 437/203 |
| 5,100,501 | 3/1992 | Blumenthal et al. .............. 437/203 |
| 5,149,671 | 9/1992 | Koh et al. ......................... 437/183 |
| 5,169,800 | 12/1992 | Kobayashi ........................ 437/203 |
| 5,246,880 | 9/1993 | Reele et al. ....................... 437/203 |
| 5,266,446 | 11/1993 | Chang et al. ..................... 437/183 |
| 5,280,414 | 1/1994 | Davis et al. . |
| 5,376,229 | 12/1994 | Miller et al. ...................... 437/203 |
| 5,409,862 | 4/1995 | Wada et al. ...................... 437/203 |
| 5,411,918 | 5/1995 | Keible et al. ..................... 437/209 |
| 5,446,247 | 8/1995 | Cergel et al. ..................... 174/267 |

*Primary Examiner*—Kevin Picardat
*Attorney, Agent, or Firm*—Miriam Jackson; Robert F. Hightower

[57] ABSTRACT

Interconnect bumps are formed on a circuit substrate using printing or dispensing techniques with a wet photoresist layer as a mask. A conductive paste is disposed in openings of a wet photoresist layer. The conductive paste is at least partially cured before the wet photoresist layer is removed. Alternatively, the wet photoresist layer may remain if it is a photo-imagable polyimide.

16 Claims, 3 Drawing Sheets

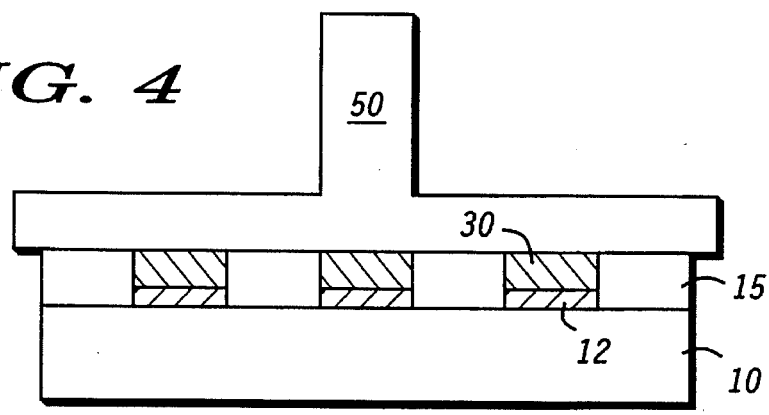
FIG. 4
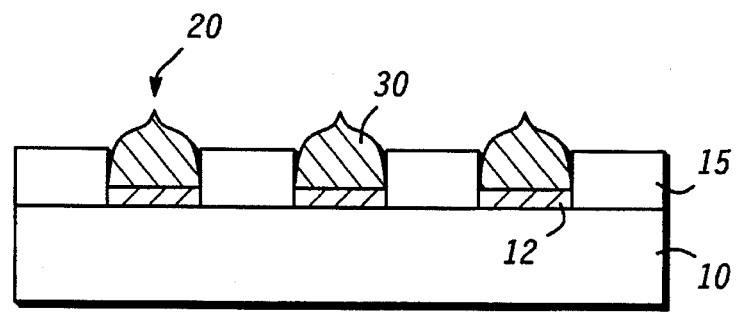
FIG. 5
FIG. 6
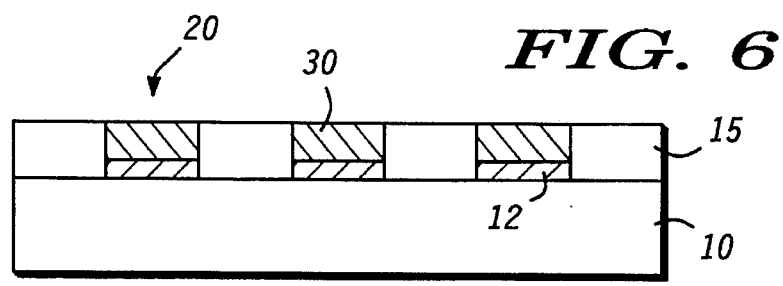
FIG. 7
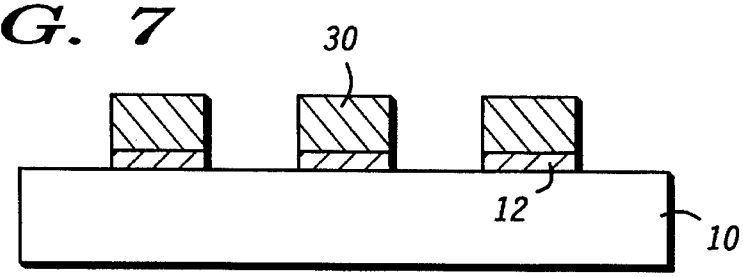

METHOD OF FORMING AN ELECTRICAL INTERCONNECT

BACKGROUND OF THE INVENTION

This invention relates, in general, to a method of forming an electrical interconnect, and more particularly, a method of forming an interconnect bump.

In the semiconductor industry, electrical contact is made to a semiconductor die by forming a bump or raised metal contact on the surface of the semiconductor die in order to facilitate electrical contact to another surface, such as a printed circuit board, a package, or lead.

In the past, this was accomplished by using a dry resist laminate, typically called a solder mask, to mask out certain portions of a printed circuit board on which the bump is not formed. The bumps are formed using solder paste which is screen printed. The dry resist laminate has been used in printed circuit board applications in order to form large interconnect bumps greater than 100 microns.

The disadvantage of using a solder mask is that small geometries are not attainable due to the minimum thickness of the dry photoresist laminate and the minimum geometries which may be printed on the dry photoresist laminate. The dry resist laminate has a thickness in the range of 75–150 microns. In printed circuit board applications, this has not been a problem because there has been no need to attain small geometry electrical contacts.

Dry resist laminates have been used to form electroplated interconnect bumps on semiconductor wafers or chips. However, these dry resist laminates are difficult to apply to semiconductor wafers. Overall, the dry resist laminates are not suitable for use in a semiconductor wafer manufacturing environment where bump geometries must be less than 50 microns and where high throughput, reduced cycle time and reduced scrap is desirable.

Another method used in the past is screen or stencil printing using a metal stencil or screen as a mask. The metal mask was used to cover portions of a semiconductor wafer so that either a solderable material was evaporated or a conductive polymer or solder paste was forced through the openings of the metal mask. One disadvantage of screen or stencil printing using a metal mask is that this technology is limited to forming bumps which are 50 microns or greater in diameter or width and a 100 micron pitch because of the difficulty of making small openings of this size in the metal mask and the accuracy of aligning the openings of the metal mask to the semiconductor wafer bond pad. In addition, this process of evaporating bumps using a metal stencil is very expensive.

There is a need to form electrical contact bumps having diameters of less than 50 microns. In addition, it would be desirable to provide a method of forming such electrical contacts at low cost and high throughput.

BRIEF DESCRIPTION OF THE DRAWINGS

FIG. 4 illustrates an enlarged, cross-sectional view of a second embodiment of the present invention in a later stage of fabrication;

FIG. 5 illustrates an enlarged, cross-sectional view of a third embodiment of the present invention in a later stage of fabrication;

FIG. 6 illustrates the present invention in a later stage of fabrication;

FIG. 7 illustrates an enlarged, cross-sectional view of an embodiment of the present invention in a final stage of fabrication;

DETAILED DESCRIPTION OF THE DRAWINGS

The present invention applies to the formation of electrical contacts on semiconductor chips. The present invention can also be utilized for the formation of a raised electrical contact on circuit substrates, such as a semiconductor wafer, a printed wire board, a flex circuit, or a metallized ceramic or glass. However, the present invention is most advantageous for use on semiconductor wafers or chips because this is where it is highly desirable to form electrical contacts having a width or diameter of 50 microns or less.

Figure 1:
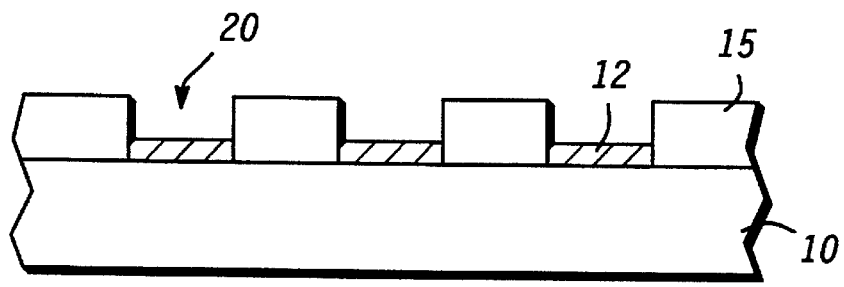
FIG. 1 illustrates an enlarged, cross-sectional view of a first embodiment of the present invention in a beginning stage of fabrication.

These electrical contacts are typically called interconnect bumps which are formed on a bond pad of a semiconductor chip. FIG. 1 illustrates a semiconductor wafer 10 having, for example, a plurality of semiconductor chips (comprised of semiconductor devices such as transistors, diodes or integrated circuits) formed therein (not shown) and having a conductive layer 12 formed on the surface of the semiconductor wafer to make electrical contact to the appropriate regions of the integrated circuit or semiconductor device. Conductive layer 12 to be electrically contacted is typically called a bond pad. Semiconductor wafer 10 is shown in highly simplified form for illustrative convenience.

First, a layer of wet photoresist 15 is applied to the surface of semiconductor wafer 10. Wet photoresist 15 is contrasted with a dry photoresist laminate. Wet photoresist layer 15 is not a laminate but is applied by spinning on photoresist layer 15 to the surface of semiconductor wafer 10 in liquid fashion. The liquid or wet photoresist is then hardened or baked to form a solid after it has been applied to the surface of semiconductor wafer 10. Although wet photoresist layer 15 is now polymerized, it will still be referred to as a "wet" resist in order to avoid confusion with dry photoresist laminates. This is in direct contrast to a dry photoresist laminate which is not spun-on in liquid form, but is laminated directly on to a surface in solid form. Because wet photoresists are commonly used in front end semiconductor manufacturing, and dry resist laminates are not, the present invention lends itself to being highly integratable with present manufacturing processes.

Wet photoresist layer 15 may be a negative or positive resist having characteristics which allow the formation of openings or vias 20 therein. Openings or vias 20 are formed by standard patterning processes used in photolithography. Wet photoresist layer 15 can be comprised of the many wet chemistry photoresists available on the market, such as a novolak resin or a photo-imagable polyimide. The thickness of wet photoresist layer 15 is desirably in the range of 20 to 75 microns. The thickness of wet photoresist layer 15 is ultimately determined by the desired height and diameter of the interconnect bump to be formed. The thickness of wet photoresist layer 15 may be easily changed to any desired thickness by methods such as changing the speed at which semiconductor wafer 10 is spun while wet photoresist layer 15 is applied to the surface or by changing the viscosity of wet photoresist layer 15, or by multiple applications of layers of wet photoresist layer 15. This thickness is in contrast to the thickness of dry resist laminate, which is commercially only available in 10 micron increments, beginning at 20 microns.

Openings 20 overlie at least a portion of conductor layer 12. The diameter of opening 20 is dependent on the size of conductive layer 12. However, the present invention is particularly useful where opening 20 has a diameter of less than 50 microns, because, as noted previously, the dry photoresist or metal stencil or screen printing methods used in the past are unable to get down to these geometries. In addition, openings 20 may be self-aligned to conductor layer 12 which forms the bond pad. When screen printing with a metal mask, the interconnect bump is formed by aligning the metal mask to the bond pad by relying on a vision system and mechanical motion of the screen printer parts. Also, the metal mask is not in intimate physical contact with the surface of the semiconductor wafer. Thus, large misalignment tolerances must be taken into account that are not present when using a wet photoresist as a mask.

Figure 2:
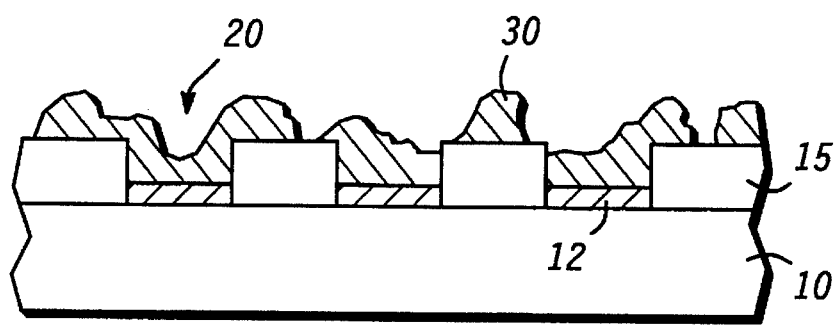
FIG. 2 illustrates an enlarged, cross-sectional view of the first embodiment of the present invention in an immediate stage of fabrication.

FIG. 2 illustrates the semiconductor structure of FIG. 1 further along in processing. A conductive paste 30 is applied to the surface of semiconductor wafer 10. Conductive paste 30 is a polymer that may be comprised of a solder paste or an epoxy paste filled with conductive particles or flakes such as silver, gold, or copper. An example of a conductive paste is Epotek H20E-PFC, available from Epoxy Technology, Inc. Preferably, conductive paste 30 is dispensed, spread, or flooded on the surface of semiconductor wafer 10 in order to roughly cover the surface of semiconductor wafer 10.

Figure 3:
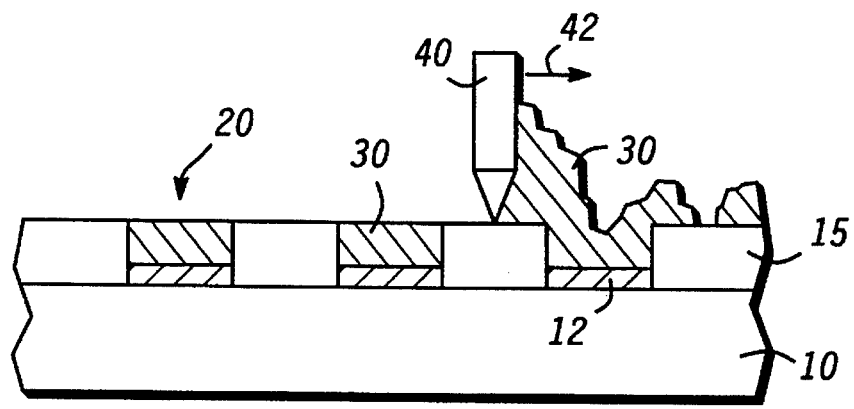
FIG. 3 illustrates the first embodiment of the present invention in a later stage of fabrication.

FIG. 3 illustrates one way to further process the structure of FIG. 2. In this embodiment, a squeegee 40 or other suitable instrument is used to sweep conductive paste 30 across wet photoresist layer 15 thereby forcing conductive paste 30 into openings 20 and removing the excess conductive paste 30 off of photoresist mask 15. It is necessary to substantially fill openings 20 and to substantially remove excess conductive paste 30 from the surface of wet photoresist layer 15. Openings 20 are substantially filled in order to provide interconnect bumps of a uniform volume and height. Substantially all of conductive paste 30 is removed means that no significant amount of conductive polymer 30 remains on wet photoresist layer 15 which is touching conductive polymer 30 in openings 20. It would be undesirable if a significant amount of conductive polymer 30 remained on wet photoresist layer 15 touching conductive polymer 30 in openings 20, because it may not be able to be removed later in the process when wet photoresist layer 15 is removed. If only a residue of conductive paste 30 remains on wet photoresist layer 15, then it will be removed at the same time wet photoresist layer 15 is removed later in the process.

FIG. 4 illustrates a second process for forming interconnect bumps after the processing of FIG. 2. Pressure is applied to conductive paste 30 through any means, such as a disk 50 having a flat surface. In this embodiment disk 50 forces conductive paste 30 into openings 20 with excess conductive paste 30 being expelled or squeezed off of the surface of photoresist layer 15.

FIG. 5 illustrates an alternate method of dispensing conductive paste 30 in openings 20. In this embodiment, dots of conductive paste 30 are dispensed into openings 20 with the use of suitable dispensing means. One such suitable means includes a dispensing system manufactured by Camalot, Inc. The tail of the dots can be removed and openings 20 completely filled by wiping off the excess or using squeegee 40 illustrated in FIG. 3 or even the process illustrated in FIG. 4.

FIG. 6 illustrates the structure of the present embodiment which results after any of the processing shown in FIG. 3, FIG. 4, or FIG. 5. In a preferred embodiment, conductive paste 30 fills opening 20 so that the surface of conductive paste 30 is planer with wet photoresist layer 15 in order to provide interconnect bumps having substantially the same height. In a preferred embodiment, conductive paste 30 is heated at a temperature above room temperature (cured) so that conductive paste 30 is resistant to a solvent used to remove wet photoresist layer 15 thereafter and will adhere to the surface of conductive layer 12. Before at least partial curing, presently available conductive pastes 30 will not adhere to conductive layer 12 adequately. Curing may preferably take place in an oven having a temperature of 120°–140° C. for approximately 5–10 minutes.

When conductive paste 30 is comprised of a solder paste, curing would take place at a temperature slightly higher than the solder's eutectic temperature, which is typically between 100° and 350° C. A high temperature wet photoresist layer or a photo-imagable polyimide would be required for use with a solder paste that cures at a temperature above 150° C. In any event, curing for a time less than a time where a wet photoresist residue is formed on the substrate that can not be later removed is necessary.

FIG. 7 illustrates the structure of FIG. 6 further along in processing. Wet photoresist layer 15 is removed by suitable methods well known in the art. In a preferred embodiment, a solvent such as acetone or other photoresist stripper is used to remove wet photoresist layer 15. Alternatively, an oxygen ($O_2$) plasma asher may be used. It should be noted that a small amount of conductive paste 30 may be left remaining on wet photoresist layer 15 as long as it is a small enough amount that can be removed with wet photoresist layer 15. Alternatively, if wet photoresist layer 15 is comprised of a photo-imagable polyimide, then it does not need to be removed because it can act as a passivation layer.

If necessary, conductive paste 30 may be further cured after wet photoresist layer 15 is removed in order to further harden conductive paste 30 now in the form of interconnect bumps for better mechanical integrity and moisture resistance. It is important to note that this second curing is desirably performed after wet photoresist layer 15 is removed because too much exposure of wet photoresist layer 15 to these temperatures for substantially greater than 10 minutes can result in the formation of a residue of wet photoresist layer 15 that can not be removed from the surface of semiconductor wafer 10. The second curing is preferably performed at temperatures between 150°–300° C. for at least 5–60 minutes. Ultimately, the time and temperature of both cure cycles will be determined by the characteristics of specific conductive pastes used. Some types of conductive pastes may not require the second curing process.

Figure 8:
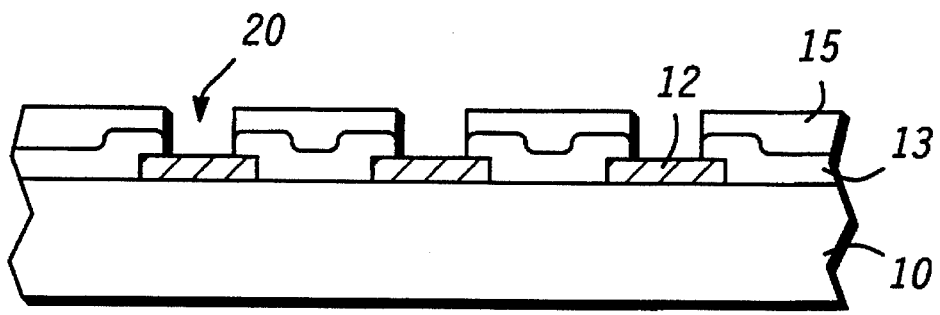
FIG. 8 illustrates a cross-sectional view of an alternative embodiment of the present invention in an intermediate stage of fabrication.

FIG. 8 illustrates an alternative embodiment of the present invention in an intermediate stage of fabrication. Elements that are the same as shown in FIG. 1 are referenced by the same numerals. This figure illustrates semiconductor wafer 10 in more detail. Processing of this embodiment is the same as the embodiment illustrated in FIG. 1, however, here a passivation layer 13 is shown formed on the surface of semiconductor wafer 10 and conductive layer 12. A wet photoresist layer 15 is formed and patterned on the surface of passivation layer 13 to provide openings 20. Here, a portion of passivation layer is removed overlying a portion of conductive layer 12. Subsequently, a conductive paste may then be applied in any of the manners described above with reference to FIGS. 2–7. The advantage of this process is that the same photoresist that is used to pattern passivation layer 13 can be utilized to form the interconnect bumps. In this process, interconnect bumps will be self-aligned to conductive layer 12 and an additional masking process of spinning on an additional wet photoresist layer 15 and removing it will be saved. This will reduce costs and improve cycle time. The removal of wet photoresist layer 15 is the same as described above. Note that the benefits of this process can not be obtained with the use of a dry resist laminate because the wet photoresist layer used to pattern passivation layer 13 can not be additionally utilized for forming conductive paste 30. In addition, wet photoresist layer 15 used to pattern passivation layer 13 can not be replaced with a dry photoresist laminate, because dry resist laminates can not print small geometries and do not have the necessary definition for small pitches that are achievable with wet chemistry photoresists.

Figure 9:
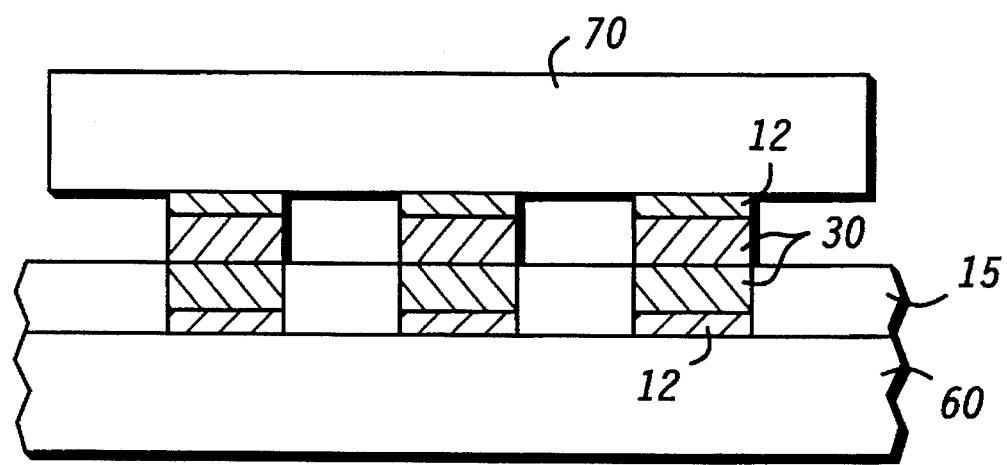
FIG. 9 illustrates an enlarged, cross-sectional view of a flip chip assembly utilizing an embodiment of the present invention.

FIG. 9 illustrates a method for forming a flip chip assembly using the techniques of the present invention. The same numerals are used to identify the same or similar elements as shown in FIGS. 1–8. A wet photoresist layer 15 is provided on a substrate 60 and patterned to form openings. Substrate 60 may be comprised of another semiconductor wafer, a printed circuit board, a flex circuit, or a metallized ceramic glass. A conductive paste 30 is formed in the openings of wet photoresist layer 15 as described above resulting in either embodiment shown in FIG. 7 or 8. Then, a singulated chip 70 having a plurality of electrical interconnects formed thereon is preferably prepared from semiconductor wafer 10 as above in FIG. 7 or 8, and placed so that conductive paste 30 now formed into interconnect bumps from chip 70 are mated with conductive paste 30 on substrate 60. Singulated chip 70 is singulated, by methods well known in the art, from semiconductor wafer 10, as shown in FIG. 1, which is comprised of a plurality of chips 70. A partial cure, also referred to as a B-stage cure, is performed as described above and wet photoresist layer 15 is removed in accordance with the teachings above, and if necessary, a second cure is performed. In this embodiment, it is important to note that the mating of substrate 60 and chip 70 must be performed before the final or second curing of conductive paste 30 of either substrate 60 or chip 70. Presently, if conductive paste 30 on both substrate 60 and chip 70 are fully cured before mating, then conductive paste 30 of substrate 60 and chip 70 will not adhere to each other thereafter.

As can be seen, a wet photoresist layer can be used in conjunction with conductive pastes to form an electrical interconnect, typically called an interconnect bump, on a semiconductor wafer in order to provide interconnect bumps having diameters or widths less than 50 microns. The ability to print small geometries with submicron accuracy in the masking layer is essential to the formation of interconnect bumps having small geometries. This capability and accuracy was not available with the use of dry photoresist laminates or stencil/screen printing with a metal mask as used in the past. The present invention allows bump geometry reduction and bump registration accuracy over the use of dry photoresist or metal mask screen/stencil printing technology. The interconnect bumps formed by the present invention are particularly advantageous for use with flip chip assembly requiring ultra-fine geometries and pitches.

What is claimed is:

1. A method of forming an electrical interconnect, comprising the steps of:

providing a substrate;

forming a conductive layer on a portion of the substrate;

forming a wet photoresist layer on the substrate and the conductive layer;

patterning the wet photoresist layer to form openings to the conductive layer;

disposing a conductive paste in at least the openings to the conductive layer;

heating the conductive paste a first time at a temperature above room temperature;

removing the wet photoresist layer; and heating the conductive paste at a temperature above room temperature a second time after the step of removing the wet photoresist layer.

2. The method of claim 1 wherein the wet photoresist layer is comprised of a photo-imagable polyimide.

3. The method of claim 1 wherein the conductive paste is comprised of a solder paste.

4. The method of claim 1 further comprising disposing the conductive paste on the wet photoresist layer and moving a portion of the conductive paste from the wet photoresist layer into the openings.

5. The method of claim 1 further comprising disposing the conductive paste on the wet photoresist layer and sweeping across the wet photoresist layer to force the conductive paste into the openings.

6. The method of claim 1 further comprising disposing the conductive paste on the wet photoresist layer and applying pressure to the wet photoresist layer across the substrate to force the conductive paste into the openings.

7. The method of claim 1 wherein the step of heating the conductive paste the first time comprises heating at a temperature between 120° and 140° C.

8. The method of claim 1 wherein the step of heating the conductive paste the first time comprises heating for a time less than or equal to 10 minutes.

9. The method of claim 1 wherein the step of heating the conductive paste the first time comprises heating for a time less than a time where a wet photoresist residue is formed on the substrate.

10. A method of forming an electrical interconnect, comprising the steps of:

providing a substrate;

forming a conductive bond pad on a portion of the substrate;

forming a wet photoresist layer on the substrate and the conductive bond pad;

forming a via in the wet photoresist layer overlying the conductive bond pad;

dispensing a conductive paste on the wet photoresist layer and in the via;

removing the conductive paste from the wet photoresist layer; and partially curing the conductive paste:

removing the wet photoresist layer after the step of partially curing the conductive paste; and curing the conductive paste a second time after the step of removing the wet photoresist layer.

11. The method of claim 10 wherein the wet photoresist is comprised of a photo-imagable polyimide.

12. The method of claim 10 wherein the conductive paste is comprised of an epoxy paste.

13. The method of claim 10 wherein the step of partially curing comprises curing at a temperature between 120® and 140° C.

14. The method of claim 10 wherein the step of partially curing comprises curing for a time less than a time where a wet photoresist residue is formed on the substrate.

15. A method of forming a semiconductor chip, comprising the steps of:

provicing a semiconductor wafer;

forming a conductive layer over the semiconductor wafer;

forming a passivation layer over the semiconductor wafer and over the conductive layer;

forming a wet photoresist layer on the semiconductor wafer;

patterning the wet photoresist layer;

forming an opening in the wet photoresist layer to expose a portion of the passivation layer over the conductive layer;

removing a portion of the passivation layer in the opening of the wet photoresist layer to expose a portion of the conductive layer;

disposing a conductive paste in at least the openings of the wet photoresist layer used to remove a portion of the passivation layer;

partially curing the conductive paste;

removing the wet photoresist layer; and curing the conductive paste.

16. A method of forming a flip chip assembly, comprising the steps of:

providing a semiconductor chip having a plurality of electrical interconnects;

providing a substrate having a conductive layer formed over portions of the substrate;

forming a wet photoresist layer over the substrate and over the conductive layer;

patterning the wet photoresist layer to form a plurality of openings in the wet photoresist layer to expose portions of the conductive layer;

disposing a conductive paste in at least the plurality of openings in the wet photoresist layer;

mating the plurality of electrical interconnects of the semiconductor chip to the conductive paste of the substrate; and curing the conductive paste of the substrate after the step of mating.

* * * * *